United States Patent [19]
Takaki et al.

[11] Patent Number: 5,976,255
[45] Date of Patent: Nov. 2, 1999

[54] SUBSTRATE HOLDER FOR REDUCING NON-UNIFORM FILM CHARACTERISTICS RESULTING FROM SUPPORT STRUCTURES

[75] Inventors: Kurita Takaki, Fuchu; Naoyuki Nozawa, Tokorozawa; Yoshiro Hasegawa, Tama, all of Japan

[73] Assignee: Anelva Corporation, Japan

[21] Appl. No.: 09/139,886

[22] Filed: Aug. 25, 1998

[30] Foreign Application Priority Data

Sep. 20, 1997 [JP] Japan ................................. 9-273487

[51] Int. Cl.⁶ .................................................. B05C 13/00
[52] U.S. Cl. ............................ 118/500; 118/728; 118/503
[58] Field of Search .................... 118/728, 500, 118/503

[56] References Cited

U.S. PATENT DOCUMENTS

| | | | |
|---|---|---|---|
| 4,558,388 | 12/1985 | Graves, jr. | 360/135 |
| 4,589,369 | 5/1986 | Mahler | 118/500 |
| 4,595,481 | 6/1986 | Allen et al. . | |
| 4,634,512 | 1/1987 | Allen et al. . | |
| 4,735,540 | 4/1988 | Allen et al. . | |
| 4,735,701 | 4/1988 | Allen et al. . | |
| 5,020,476 | 6/1991 | Bay | 118/728 |
| 5,089,110 | 2/1992 | Allen et al. . | |
| 5,125,359 | 6/1992 | Barale | 118/725 |
| 5,296,118 | 3/1994 | Allen et al. . | |
| 5,543,022 | 8/1996 | Nguyen et al. | 204/298.15 |

FOREIGN PATENT DOCUMENTS

| | | |
|---|---|---|
| 5-23570 | 6/1993 | Japan . |
| 8-274142 | 10/1993 | Japan . |
| 5-94267 | 12/1993 | Japan . |

*Primary Examiner*—Bruce Breneman
*Assistant Examiner*—Erin Fieler
*Attorney, Agent, or Firm*—Coudert Brothers

[57] ABSTRACT

A substrate holder to support a substrate in a vertical position in a substrate processing device that performs a process on the substrate, where the process involves forming a plasma in the space around the substrate. The substrate holder includes a base plate and a plurality of supporting claws that are attached to the base plate and arranged so as to come into contact with the outer edge of the substrate and provide vertical support for the substrate. At least one of the plurality of supporting claws is a movable supporting claw that can be brought into contact with and separated from the outer edge of the substrate. When a substrate has been loaded into the holder, the space around the substrate is substantially filled by the base plate or by a member attached to the base plate. The gap formed around the periphery of the substrate between the substrate and base plate is narrower at locations in the circumferential direction to the front and rear of the supporting claws, compared to that at other positions in the circumferential direction along the periphery of the substrate.

10 Claims, 8 Drawing Sheets

(Prior Art)

SUBSTRATE HOLDER FOR REDUCING NON-UNIFORM FILM CHARACTERISTICS RESULTING FROM SUPPORT STRUCTURES

BACKGROUND OF THE INVENTION

1. Field of the Invention

The present invention relates to apparatus used in substrate processing, and more specifically, to a substrate holder used to support a substrate in a vertical position during the performance of a process on the surface(s) of the substrate.

2. Description of the Prior Art

The surfaces of substrates are routinely subjected to various processes in the production of LSIs (large scale integrated circuits), LCDs (liquid crystal displays), and data storage disks. In the production of data storage disks of the type used in "hard disk" drives, a substrate holder may be used to vertically support a substrate having a hole formed in its middle. This permits a processing step, e.g., thin film deposition, to be efficiently performed on both sides of the substrate.

Figure 6:
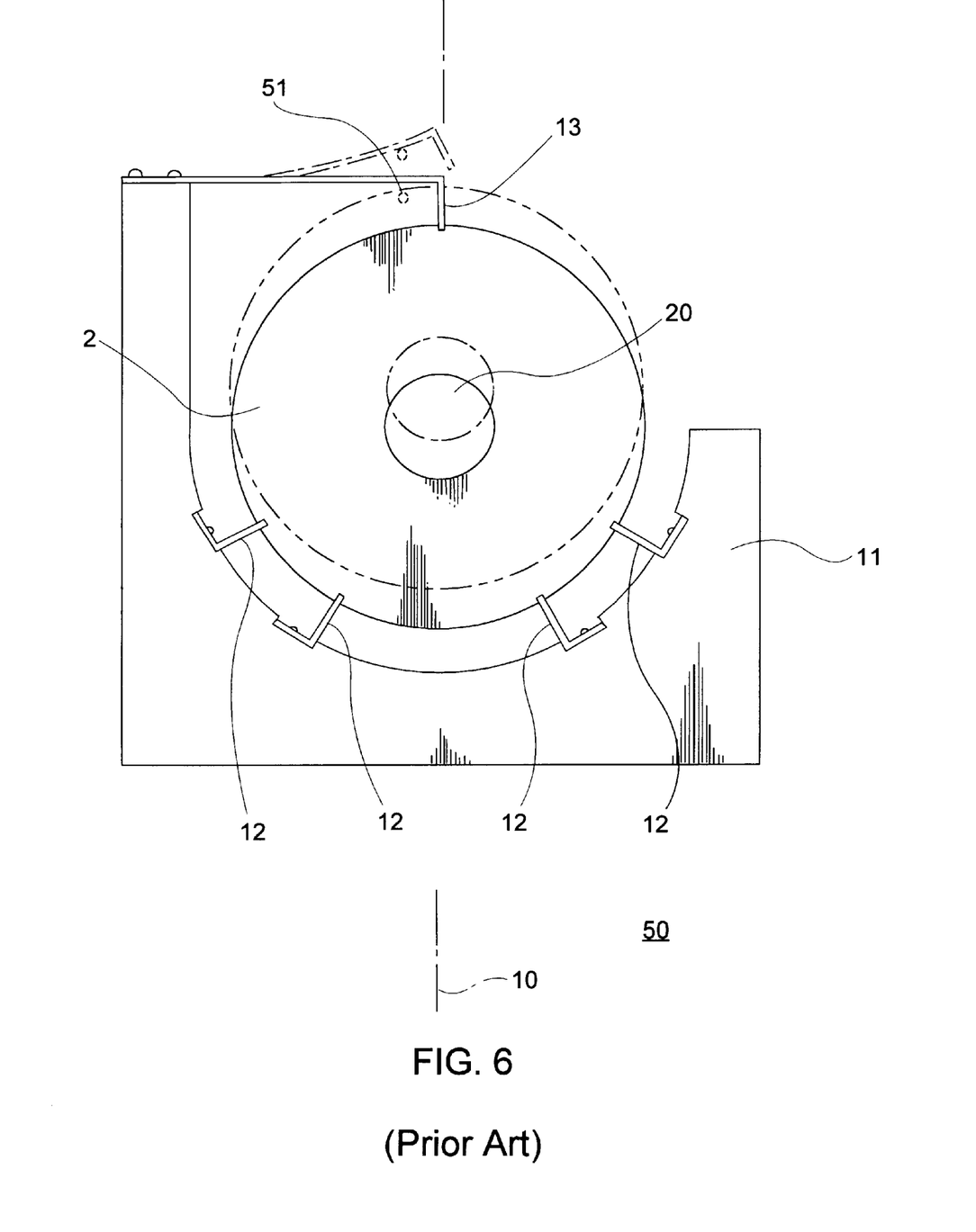
FIG. 6 is a front view showing a prior art substrate holder.
Figure 7:
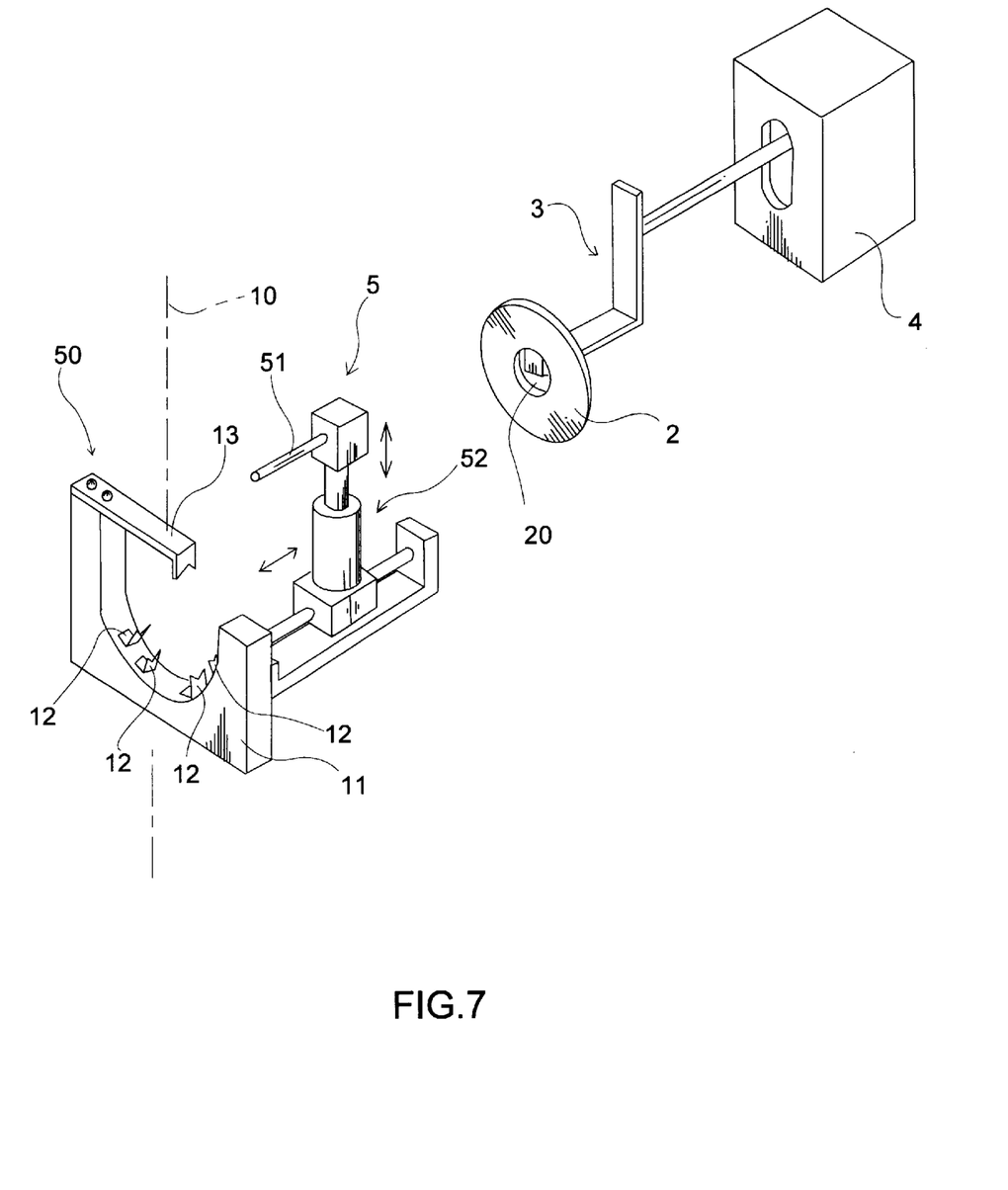
FIG. 7 is an isometric view which illustrates the operation of the substrate holder shown in FIG. 6.

FIG. 6 is a front view showing a prior art substrate holder 50. FIG. 7 is an isometric view which illustrates the operation of substrate holder 50 shown in FIG. 6. Substrate holder 50 shown in FIGS. 6 and 7 includes a vertical base plate 11, fixed supporting claws 12, and a movable claw 13, with claws 12 and 13 connected to base plate 11.

As shown in FIGS. 6 and 7, base plate 11 is shaped in the form of a rectangular plate and is provided with a "J"-shaped cut-out. The curved portion of this "J"-shaped cut-out (referred to as the "curved part") is typically provided with four fixed support claws 12. As FIGS. 6 and 7 show, fixed support claws 12 are disposed at positions arranged symmetrically about a vertical line 10 passing through the lowest point of the "J" (referred to as "central axis 10").

Each of fixed support claws 12 is an "L" shaped member formed by bending a thin ribbon-shaped piece of metal or similar material. Notches are provided in the cut-out portion of base plate 11, and fixed support claws 12 are each disposed within the notches. The support claws 12 are fixed to base plate 11 with screws. The end of each fixed supporting claw 12 points toward the center of curvature of the curved part, and "V"-shaped indentations are formed at their distal ends as shown in FIG. 7.

Movable support claw 13 is fixed to the upper surface of base plate 11. Movable support claw 13 is also a ribbon-shaped member bent into an "L" shape. One end of movable claw 13 is fixed to the upper end surface of base plate 11 with screws, with the distal tip portion positioned directly on central axis 10 and pointing downward. A "V"-shaped indentation is formed in the downward distal end of moveable claw 13 in the same manner as for fixed support claws 12.

The operation of the above mentioned conventional substrate holder 50 will now be described. Substrate holder 50 supports a substrate 2 which is a flat disk with a hole 20 at its center, e.g., a hard disk substrate. Substrate 2 is placed in and removed from substrate holder 50 by a transfer mechanism 4 equipped with a substrate pick-up 3 that holds substrate 2 (see FIG. 7).

As FIG. 7 shows, an opening/closing device 5 which actuates movable support claw 13 is positioned near substrate holder 50. Movable support claw 13 acts as a leaf spring, and opening/closing device 5 includes an opening/closing pin 51 which causes movable support claw 13 to bend by displacing the end of movable support claw 13 upwards. Opening/closing device 5 also includes a moving mechanism 52 which causes pin 51 to displace the end of claw 13 laterally toward or away from substrate holder 50 to engage or disengage pin 51 from claw 13.

The way in which a substrate 2 is loaded on substrate holder 50 will now be described. After substrate pick-up 3 engages substrate 2 by inserting its tip into hole 20 in the center of substrate 2, the substrate is transferred horizontally to the vicinity of substrate holder 50 by transfer mechanism 4. Pin 51 of opening/closing device 5 is moved horizontally (i.e., laterally) by moving mechanism 52 to a position below movable support claw 13 of substrate holder 50. Pin 51 moves up, causing movable support claw 13 to bend and be displaced upward, as shown by the dotted line in FIG. 6. This opens movable support claw 13.

Transfer mechanism 4 then moves substrate 2 into alignment with base plate 11 such that substrate 2 is positioned between movable support claw 13 and fixed support claws 12. Transfer mechanism 4 then causes substrate pick-up 3 to descend slightly, such that substrate 2 rests on and is supported by fixed support claws 12.

Moving mechanism 52 of opening/closing device 5 then causes pin 51 to descend, such that movable support claw 13 is returned to an approximately horizontal position (the solid line in FIG. 6). This causes the end of movable support claw 13 to contact the upper edge of substrate 2, pressing down on substrate 2 from above. Substrate pick-up 3 then withdraws from substrate holder 50 and is returned to a standby position by transfer mechanism 4, ready to pick up another substrate. Pin 51 is then disengaged from moveable claw 13 and is also moved to a prescribed "standby" position.

When extracting substrate 2 from substrate holder 50 the opposite procedure is performed. Moving mechanism 52 of opening/closing device 5 causes pin 51 to move to a position below movable support claw 13, and then lifts pin 51, displacing the end of movable support claw 13 and disengaging it from the substrate. Transfer mechanism 4 inserts the end of substrate pick-up 3 into hole 20 in the center of substrate 2. Substrate pick-up 3 rises up slightly to hold and disengage substrate 2 from support claws 12. Transfer mechanism 4 then withdraws substrate 2 away from substrate holder 50.

Figure 8:
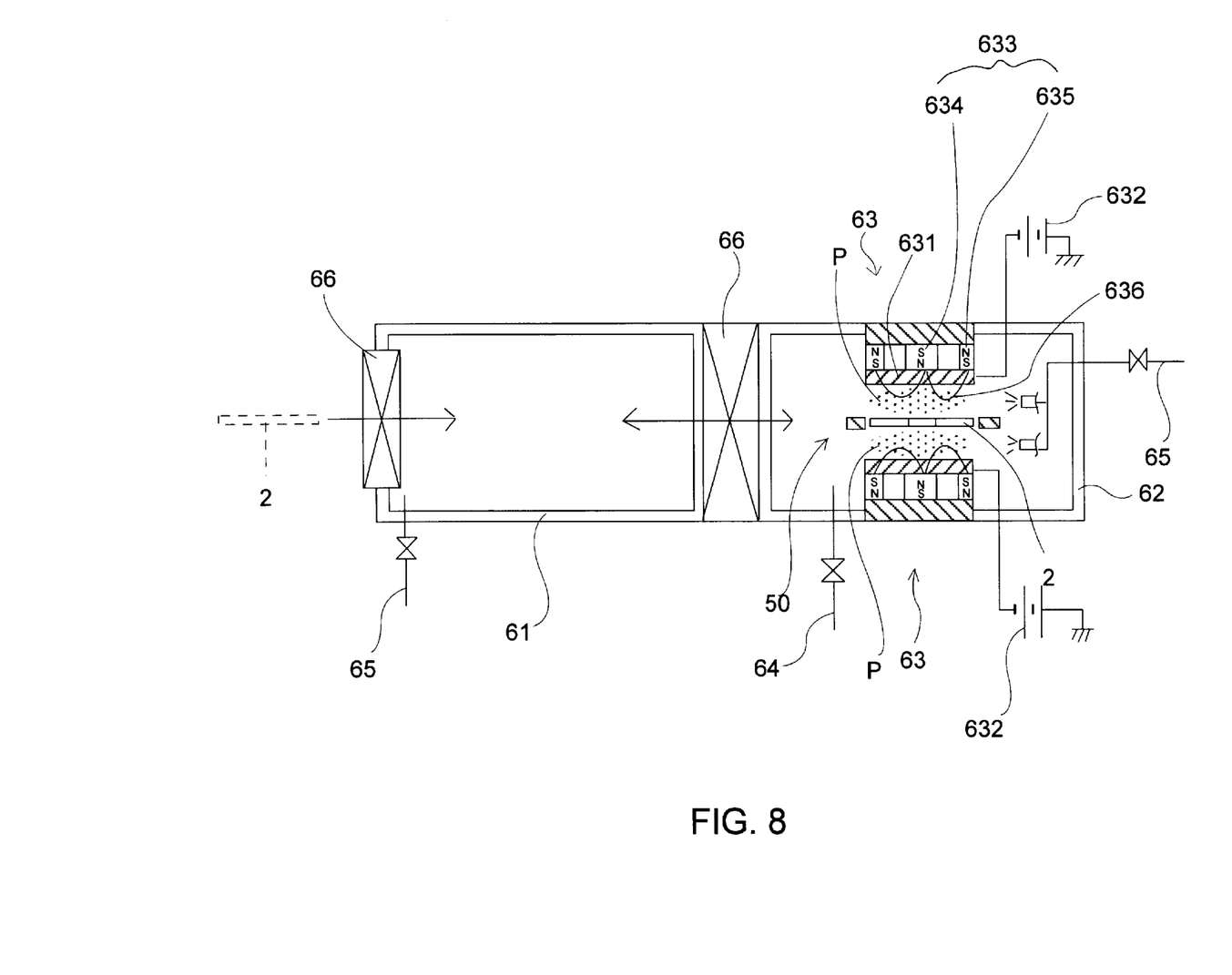
FIG. 8 is a plan view of an exemplary substrate processing device which uses the substrate holder.

FIG. 8 is a plan view of an exemplary substrate processing device which uses substrate holder 50 of FIGS. 6 and 7. The substrate processing system shown in FIG. 8 includes a substrate loading/unloading chamber 61 and an adjacent processing chamber 62 separated by gate valve 66. Chamber 61 may be a load lock chamber. A substrate 2 to be processed is loaded on substrate holder 50 inside chamber 61. Each substrate 2 is supplied to process chamber 62 on a separate substrate holder 50. After substrate 2 has been processed in processing chamber 62, substrate holder 50 is returned to chamber 61, where it is removed from substrate holder 50.

As an example of a substrate processing device, FIG. 8 illustrates a sputtering device which produces magnetic thin films. Two sputtering sources 63 are provided inside of processing chamber 62. Sputtering sources 63 each consist of a sputter target 631 and a magnet assembly 633 provided at the rear of target 631. A sputtering power source 632 which applies a prescribed voltage to target 631 is also provided.

Magnet assembly 633 comprises a central magnet 634 and a ring-shaped peripheral magnet 635 which surrounds central magnet 634. Magnet assembly 633 establishes arch-shaped magnetic flux lines 636 passing through target 631. When a voltage is applied to the target at low pressure, magnetic flux lines 636 give rise to magnetron sputtering.

Process chamber 62 is equipped with a vacuum pumping system 64 and process gas supply system 65 for the introduction of a process gas into its interior. When sputtering power source 632 is operated while introducing the process gas into chamber 62, a magnetron sputtering discharge occurs in the space adjacent to the surface of target 633, and a magnetron plasma, P, is formed in the regions between the sources 63 and the substrate.

As FIG. 8 shows, the pair of sputtering sources 63 are provided on both sides of substrate 2 which is supported by substrate holder 50. Accordingly, magnetron plasma P is formed on both sides of substrate 2, and film deposition is performed simultaneously on the surfaces of both sides of substrate 2.

It is desired that a substrate processing system, such as the one described, be capable of producing highly uniform films on the entire surface of the substrate. For example, in a process to make magnetic thin films on substrates for magnetic recording media, the processing device should produce a high-quality magnetic thin film on both sides of the substrate that extends as close as possible to the outer edge of the substrate in order to increase the recording capacity of the disk.

However, in research conducted by the present inventors, it was determined that when a substrate holder of the type described with reference to FIGS. 6–7 is used, although a high-quality magnetic thin film can be made in the central portion of the substrate, the film is not uniform across the entire surface of the substrate. In particular, it was determined by the inventors that films produced using substrate holder 50 have localized defects (i.e., non-uniform film quality) in regions near the edge of the substrate.

Figure 9A:
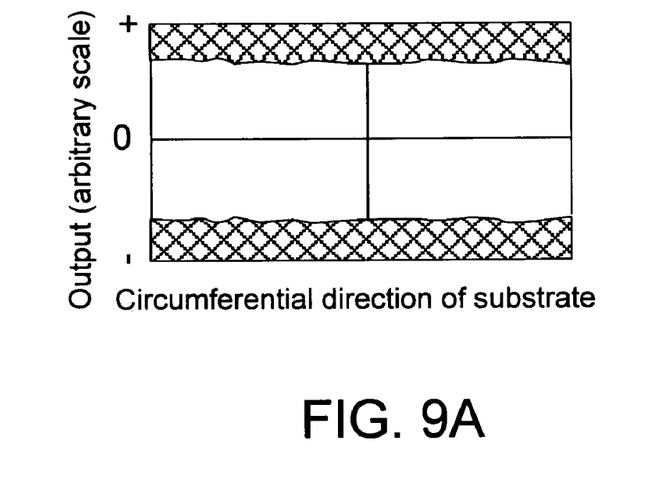
FIG. 9A is a graph showing the magnetic characteristics of a magnetic thin film deposited on a 95 mm diameter substrate using the conventional substrate holder of FIGS. 6 and 7 at a radial distance of 40 mm from the substrate center.
Figure 9B:
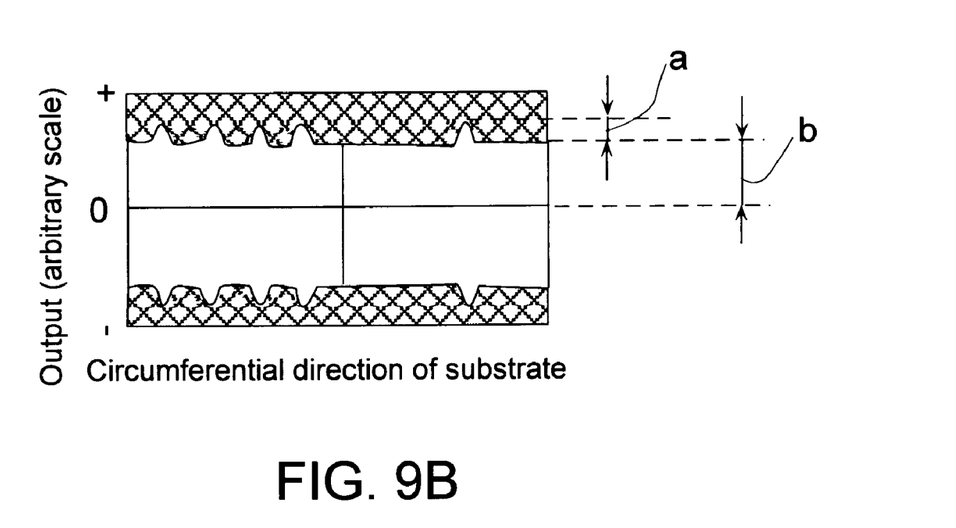
FIG. 9B is a graph showing the magnetic characteristics of a magnetic thin film deposited on a 95 mm diameter substrate using the conventional substrate holder of FIGS. 6 and 7 at a radial distance of 46.5 mm from the substrate center.

FIGS. 9A and 9B are graphs which illustrate the problem caused by using a conventional substrate holder which is remedied by the present invention. FIGS. 9A and 9B show the modulation characteristics of a magnetic thin film produced using substrate holder 50 shown in FIGS. 6 and 7. The modulation characteristics indicate whether or not there are abnormalities in the modulation (i.e. output signal) of a signal read back from a substrate. In the present case, they show whether or not the magnetic characteristics of the magnetic thin film produced on the substrate are uniform in the area at the periphery of the substrate. Note that FIGS. 9A and 9B represent the magnitudes of the coercive force and remnant magnetic flux in the circumferential direction, with those characteristics being represented by an electrical signal.

FIG. 9A is a graph showing the characteristics of a magnetic thin film deposited on a substrate 95 mm in diameter using the conventional substrate holder of FIGS. 6 and 7 at a radial distance of 40 mm from the substrate center. FIG. 9B is a graph showing the magnetic characteristics of a magnetic thin film deposited on a substrate 95 mm in diameter using the conventional substrate holder of FIGS. 6 and 7 at a radial distance of 46.5 mm from the substrate center. As the figures show, the magnetic characteristics are uniform at 40 mm, because the modulation curve is essentially constant. However, at 46.5 mm from the center, unwanted modulation occurs as indicated by peaks or localized jumps in the magnetic characteristics (which are observed at five places in the graph) showing that the film is not uniform. Occurrence of this sort of modulation is likely to result in errors during magnetic recording, and is a source of bad sectors on the storage medium.

After making a detailed study of the factors which might be responsible for causing these modulation peaks, the present inventors concluded that the positions of the peaks correspond to the positions of the support claws of the substrate holder shown in FIG. 6. That is, the positions of the peaks of FIG. 9B coincides with the positions of the support claws. The inventors have concluded that the support claws are responsible for the observed non-uniformity in the magnetic characteristics of the film.

The inventors have determined that the nonuniformity caused by the support claws is due to the influence of the support claws on the plasma formed during film deposition. In a conventional substrate holder 50 shown in FIG. 6, the plasma enters the space or gap between the edge of the cut-out in the base plate of the substrate holder and the outer edge of the substrate. The entry of plasma becomes a problem when a bias voltage more positive than the sputter cathode voltage is applied to the substrate.

Since the support claws are normally formed of a stainless steel or other metal, electrons and negative ions from the plasma flow freely to the grounded parts of the substrate holder through the support claws (e.g., when the support claws are held at ground potential). The flow of charged particles out of the plasma in the vicinity of the support claws causes local plasma changes in the characteristics of the plasma, with the plasma variation occurring where the support claws are present. This local change in the plasma characteristics produces the observed localized variations in the magnetic characteristics of the film deposited on the substrate.

A study was performed by the inventors involving the application of a negative bias voltage to the substrate to draw positive ions from the plasma for use in processing of the substrate. In the study, the supporting claws acted as electrodes for applying the negative bias voltage to the substrate. This study confirmed that when plasma enters into the gap between the substrate edge and the base plate, the characteristics of the plasma are significantly changed by the presence of the support claws, and the unwanted localized variation of magnetic characteristics of the type shown in FIG. 9B will occur. This has a detrimental effect on the data storage ability of the affected region of the disk, and acts to reduce the overall storage capacity of the disk by reducing the usable area of the disk.

What is desired is a substrate holder that allows disposition of films with a uniform quality over the entire surface of a substrate, i.e., without the localized variation of characteristics which arise from the presence of the support claws which are found in the prior art.

SUMMARY OF THE INVENTION

The present invention is directed to a substrate holder to support a substrate in a vertical position in a substrate processing device which uses a plasma in the space around the substrate. The substrate holder includes a base plate and a plurality of support claws that are attached to the base plate and arranged so as to come into contact with the outer edge of the substrate and provide support for the substrate. At least one of the support claws is a movable support claw that can engage the outer edge of the substrate. When a substrate has been loaded into the holder, the space around the substrate is substantially filled by the base plate or by a member attached to the base plate. The gap formed around the periphery of the substrate between the substrate and base plate is narrower at locations near the support claws.

In addition, to assist in solving the noted problems with the prior art substrate holder, in the present invention the gap between the substrate and the base plate or the member attached to the base plate is 7 mm or less at positions to the front and rear of each of the support claws in the circumferential direction. The movable supporting claw is attached to an opening/closing arm hinged to the base plate, with the opening/closing arm having a shape that extends along part of the outer edge of the substrate while maintaining an equidistance from it. The opening/closing arm has a configuration such that its distance from the portion of the outer edge of the substrate along which it extends is 7 mm or less.

DETAILED DESCRIPTION OF THE INVENTION

Figure 1A:
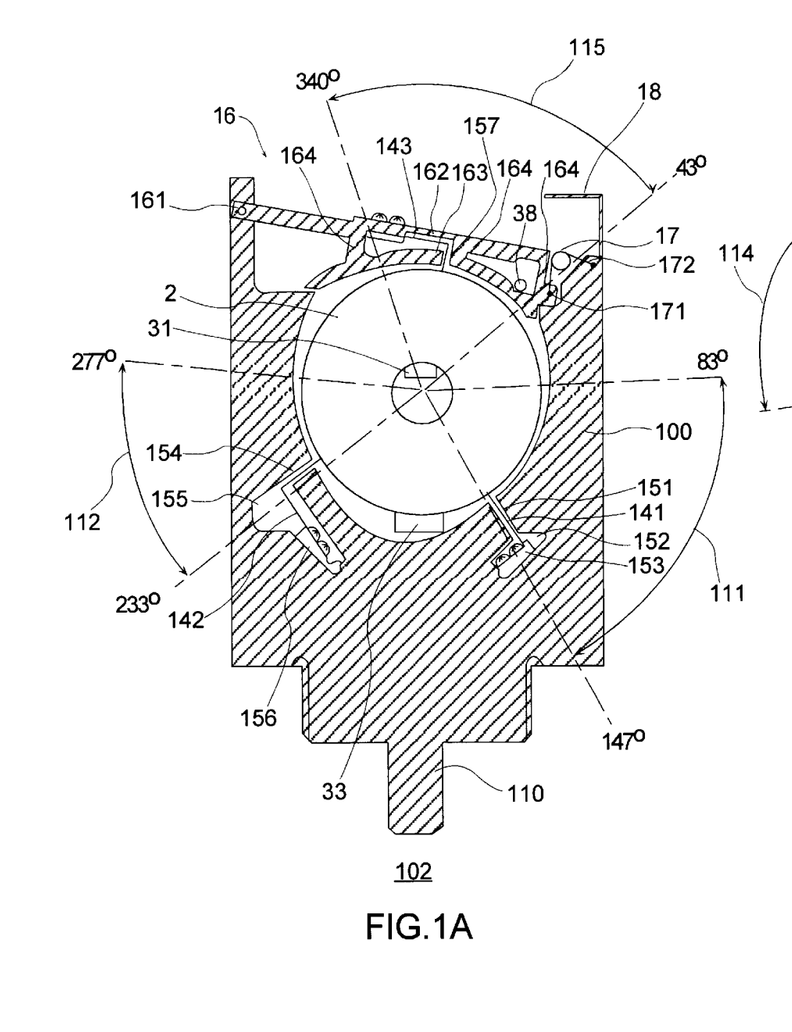
FIG. 1A shows a front view of a substrate loaded in the substrate holder of the present invention.
Figure 1B:
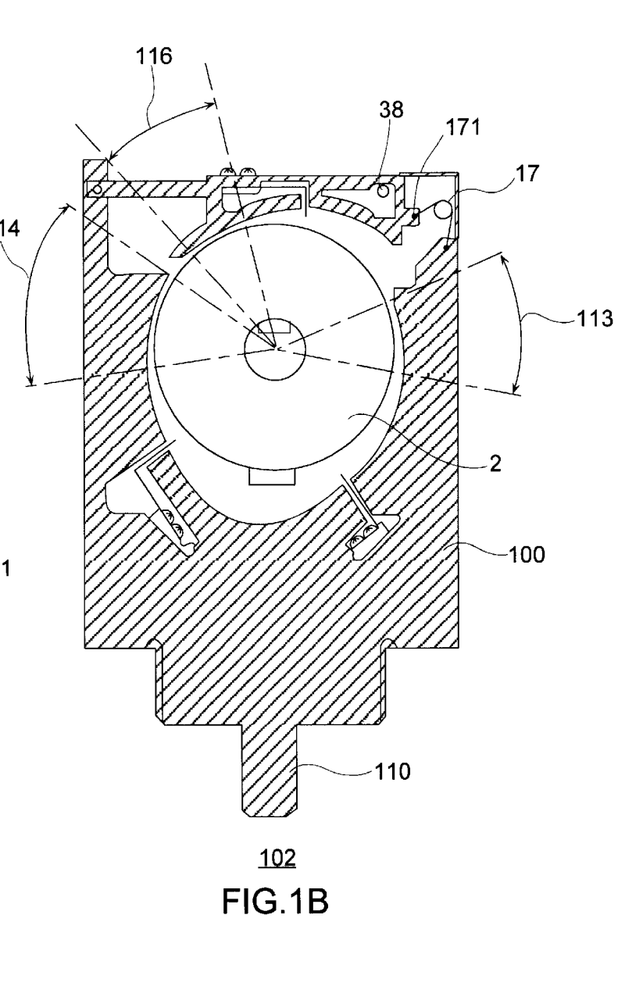
FIG. 1B shows a front view of the substrate holder of the present invention, indicating how a substrate is temporarily lifted up to a raised position when the substrate is loaded into and removed from the substrate holder.

FIG. 1A shows a front view of a substrate loaded in substrate holder 102 of the present invention. FIG. 1B shows a front view of substrate holder 102 of the present invention, indicating how a substrate 2 is temporarily lifted up to a raised position when the substrate is attached to and removed from substrate holder 102.

Substrate holder 102 shown in FIG. 1 includes a base plate 100 and a plurality of support claws 141, 142 and 143 attached to base plate 100 which engage the outer edge of substrate 2 to support substrate 2 in a vertical position.

As shown in the figure, base plate 100 has the overall shape of a rectangular plate. At the bottom part of base plate 100 is formed an attachment part 110 to which a carrier (not illustrated) is attached. The carrier is a mechanism that transfers the substrate holder, on which a substrate 2 is supported, to a desired location.

In the central region of base plate 100, a cut-out is formed to make a roughly circular opening, as shown in FIG. 1. The center of this opening corresponds with the center of substrate 2 when substrate 2 is loaded (referred to as the "supported center").

As shown in FIG. 1, the edge of the opening forms part of a circle labeled 111 from approximately 83 degrees to 147 degrees. The edge of the opening also forms part of a circle labeled 112 from approximately 233 degrees to 277 degrees.

Circular portions 111 and 112 are arcs of a circle having the same radius. This radius is approximately 3 mm larger than the radius of substrate 2. Thus, as FIG. 1A shows, when substrate 2 is loaded, the peripheral edge of substrate 2 and the edge of the opening of base plate 100 are separated by a gap of approximately 3 mm (referred to as the "circular separation gap" in the following) at circular portions 111 and 112.

A shape that is more concave than a circle is formed at the edge of the opening between circular portions 111 and 112 (moving in a clockwise direction around the holder). As discussed below, this is to provide a parking position for the substrate pick-up (element 33 of FIG. 3) on which substrate 2 is supported during loading and unloading.

A first passage 151 is formed in base plate 100 in a radial direction at a position near the lower end of circular portion 111 (i.e., near the 147 degree position). A first support claw 141 is disposed inside this first passage 151.

First support claw 141 is an "L"-shaped member as shown in FIG. 1. Claw 141 may be fabricated from a thin, rectangular piece of metal bent into an "L" shape. An opening 152 is formed at the end of passage 151 for mounting support claw 141. Part 153 which fixes first support claw 141 is provided at the edge of opening 152. The end of first support claw 141 is attached to part 153 by a screw or other suitable fastener.

Figure 2:
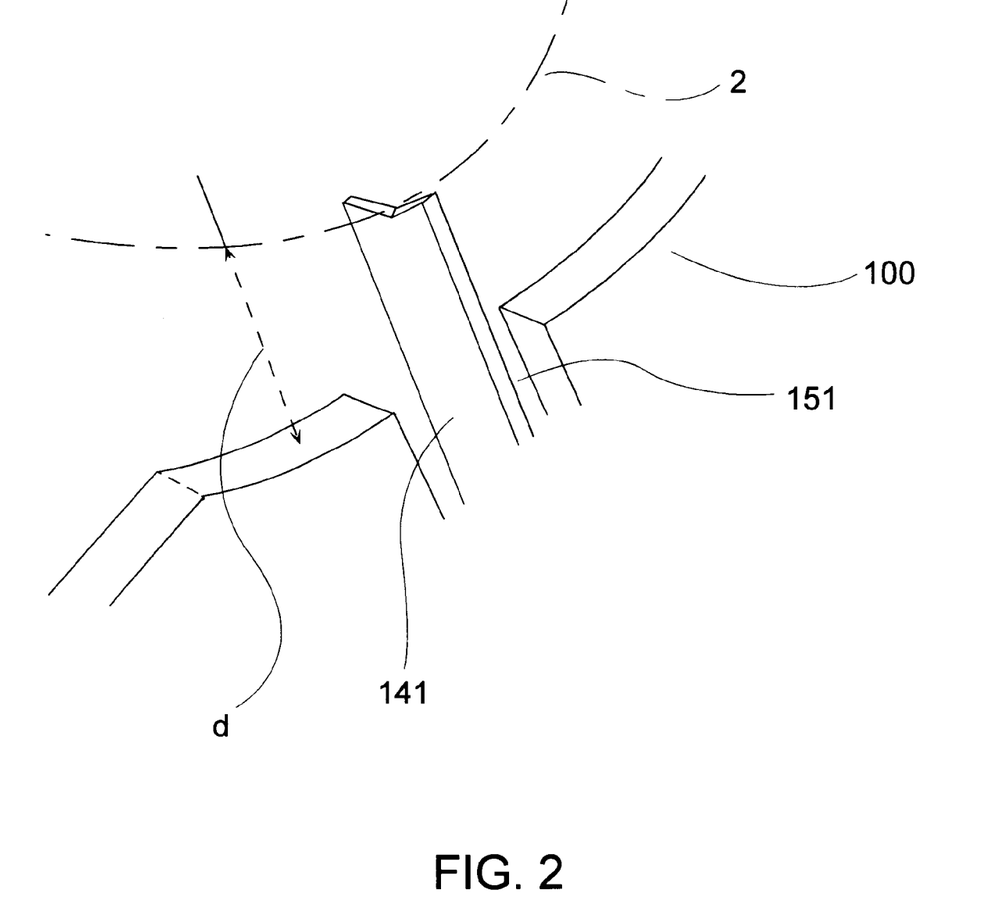
FIG. 2 is a cut-away isometric view showing the tip shape and projection length of the first support claw of the substrate holder of the present invention

FIG. 2 is an isometric view showing the tip shape and projection length of first support claw 141 of FIG. 1. The tip of first support claw 141 is formed into a shallow "V" shape or notch, having a depth of about 0.5 mm. When substrate 2 is held by support claw 141, the gap between the substrate and the edge of the opening in the substrate holder in the vicinity of the support claw is set at 3.0 mm. Accordingly, the top of the V at the tip of support claw 141 is 3.5 mm from the edge of the opening. This distance, called the "projection length," is smaller than the length (e.g. about 10 mm) by which fixed support claw 12 projects from the edge of the cut-out in the conventional substrate holder shown in FIG. 6.

If the depth of the "V" is increased to about 2 mm and the projection length is set to about 5 mm, substrate 2 is supported in a more stable manner, because a steeper V is more effective in preventing lateral movement of the substrate. However, if the depth of the "V" is made too great, the shadow effect whereby the tip parts of supporting claw 141 cast a shadow which blocks film deposition regions near the support claw 141, is increased.

Referring again to FIG. 1, a second radial passage 154 is formed at the bottom end of second portion 112 (i.e., near the 233 degree position). A second support claw 142 is disposed in this second passage 154.

Second support claw 142 is also an "L"-shaped member as shown in FIG. 1. A second opening 155 is formed at the end of second passage 154, and part 156 which is used to mount second support claw 142 is provided at the edge of opening 155. The end of support claw 142 is fixed to part 156 with screws or another suitable fastener. The tip of second support claw 142 has the same shape and projection length as that of the tip of first support claw 141 as shown in FIG. 2.

The edge of the opening in the substrate holder above circular portion 111 is also made to form part of a circle. This is referred to as "third circular portion 113". The center of this third circular portion is the same as the center point of substrate 2 when the substrate is in the raised position while it is being loaded or unloaded from the substrate holder as shown in FIG. 1B. The gap between the edge of circular portion 113 and the outer edge of substrate 2 when in the raised position is about 3 mm.

The edge of the opening in holder 102 above second circular portion 112 also forms a part of a circle concentric with the raised center. This part is referred to as "fourth circular portion 114", and the distance between this fourth circular portion 114 and the outer edge of substrate 2 in the raised position is also about 3 mm.

An arm 16 is provided at the upper side part of base plate 100. Arm 16 is hinged at one end near an upper corner of base plate 100, as shown in FIG. 1. Arm 16 is able to rotate within a specific range of angles about hinge 161.

As FIG. 1 shows, arm 16 comprises a straight portion 162 at the top, a circular portion 163 positioned below straight portion 162, and three linking parts 164 which connect straight portion 162 with circular portion 163. The edge of circular portion 163 distal from hinge 161 has an arcuate shape that extends along a part of the upper periphery of substrate 2 when the substrate is loaded, maintaining a substantially constant gap width. This arcuate edge of circular portion 163 is referred to as "fifth circular portion 115". The gap between the outer edge of substrate 2 and fifth circular portion 115 is set to be approximately 3 mm. Circular portion 163 extends from approximately 340 degrees (−20 degrees) to 43 degrees.

The edge of circular portion 163 towards hinge 161 also has a circular shape referred to as the "sixth circular portion 116". Sixth circular portion 116, like circular portions 113 and 114, is substantially concentric with the raised center as shown in FIG. 1B.

A movable support claw 143 is provided at a position near the middle of arm 16 as shown in FIG. 1. The three linking parts 164, which connect straight portion 162 with circular portion 163, define two openings in arm 16. A third passage 157 is formed in base plate 100 and a portion of support claw 143 is positioned in the passage as described below.

Movable support claw 143 is formed into an "L" shape similar to that of the other support claws. Movable support claw 143 is mounted on the underside of straight portion 162 as shown.

The tip of movable support claw 143 projects towards the center of substrate 2 when the substrate is held in holder 102. The shape, dimensions and projection length of the tip of movable support claw 143 are typically the same as those of the first and second support claws 141 and 142.

End 171 of a coil spring 17 is secured to the distal end of arm 16. The second end 172 of coil spring 17 is secured to base plate 100 as shown in FIG. 1. When arm 16 is pivoted around hinge 161, coil spring 17 pivots about second end 172.

When substrate 2 is loaded as shown in FIG. 1A, coil spring 17 pushes substrate 2 down by pushing arm 16 downward. This assists in supporting and stabilizing substrate 2 in substrate holder 102.

As FIG. 1A shows, when substrate 2 has been loaded by supporting it on first and second supporting claws 141 and 142, if substrate 2 is moved slightly away from first and second supporting claws 141 and 142, substrate 2 pushes upward on movable support claw 143. However, coil spring 17 resists the upward force in order to maintain the constant gap and prevent movement of the substrate.

However, when arm 16 rotates upward beyond a predetermined position, first and second ends 171 and 172 of coil spring 17 rather than being squeezed together move further apart. When this position is reached, the elastic force of coil spring 17 acts to push arm 16 upwards.

The critical point at which the behavior of coil spring 17 changes the direction of its force is the point where the distance between first end 171 and second end 172 of coil spring 17 reaches a minimum. This position is termed the "dead point".

When arm 16 turns upward beyond the dead point, the elastic force of coil spring 17 changes direction so that it pushes arm 16 up instead of holding it down.

Figure 3:
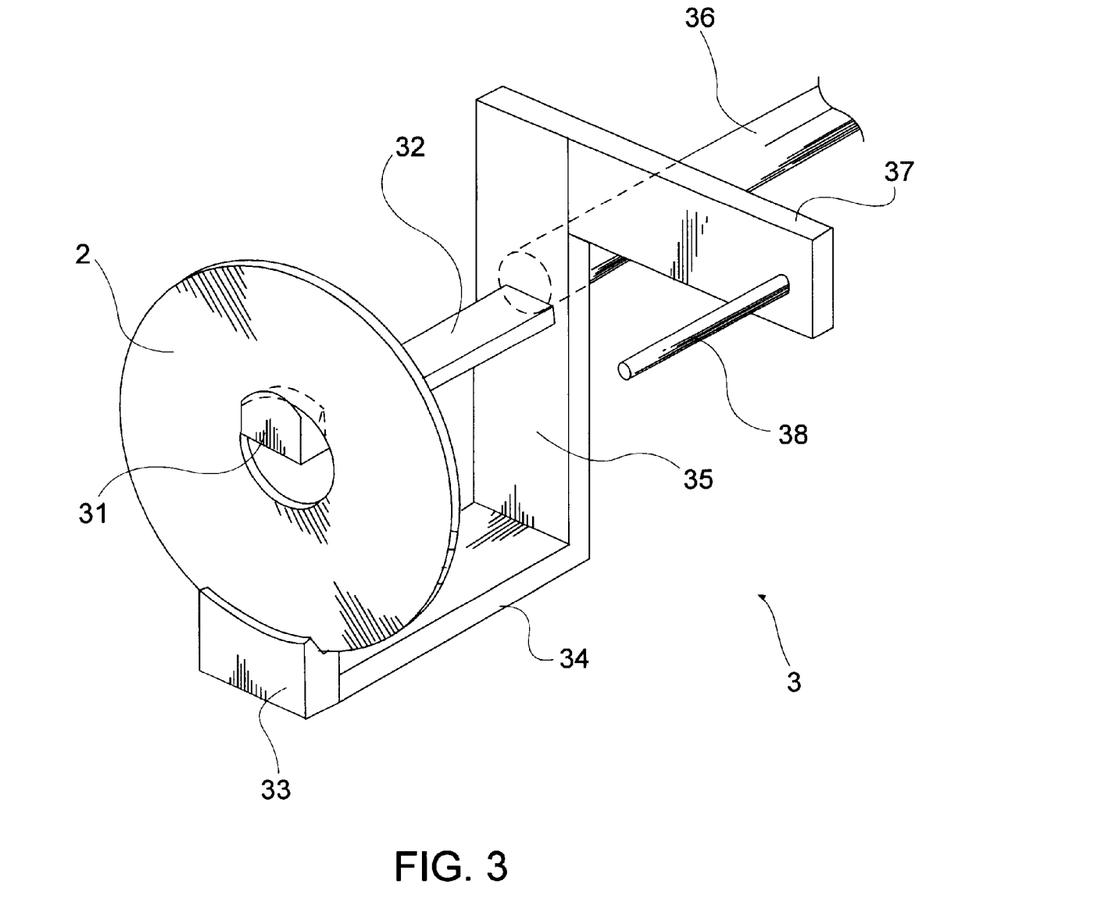
FIG. 3 is an isometric view of a substrate loading/unloading device used to load and unload substrates from the substrate holder of FIG. 1.

In operation, rod 38 of substrate pick-up 3 (see FIG. 3) is inserted into the opening at the right side of arm 16. Arm 16 is opened and closed by the up and down movement of rod 38. The operation of arm 16 and rod 38 is described with reference to FIG. 3. FIG. 3 is an isometric view of the device used to load substrates on and unload substrates from the inventive substrate holder of FIG. 1.

Substrate pick-up 3 includes a vertical central lifting plate 31 that engages the edge of the central opening of substrate 2, a horizontal plate 32 which has central lifting plate 31 fixed to its tip, a peripheral lifting plate 33 which supports the lower edge of substrate 2, and a second horizontal plate 34 which has peripheral lifting plate 33 fixed to its tip. Horizontal plates 32 and 34 are mounted on plate 35. Rod plate 37, on which rod 38 is mounted, is attached to plate 35. Drive rod 36 is attached to the back of plate 35. Drive rod 36 is provided with a moving mechanism (not illustrated) which is capable of moving the entire substrate pick-up 3 in the horizontal and vertical directions.

The operations used to load and unload a substrate 2 from the substrate holder 102 of the present invention will be described with reference to FIGS. 1A, 1B, and 3. The loading of substrate 2 in the substrate holder is described first.

As shown in FIG. 3, substrate 2 is supported by substrate pick-up device 3. The moving mechanism (not illustrated) moves the substrate 2 to the position shown in FIG. 1B. Substrate 2 is positioned inside the cut-out in base plate 100 so that the center of substrate 2 matches the raised center position. At this time, opening/closing arm 16 is positioned so that straight part 162 is approximately horizontal as shown in FIG. 1B; that is, arm 16 is open, with the tip of rod 38 inserted into the cavity in arm 16.

The moving mechanism (not illustrated) then lowers substrate pick-up 3. Substrate 2 descends and is rested on first and second support claws 141 and 142. The center of substrate 2 is then at the supported center position (i.e., the loaded state of FIG. 1A). As the substrate is lowered, rod 38 also descends and pushes arm 16 down. When arm 16 is lowered, movable support claw 143 comes into contact with the top edge of substrate 2 as shown in FIG. 1A. As arm 16 is lowered, coil spring 17 rotates, passing through the dead point and pushes down on arm 16. Accordingly, loaded substrate 2 is securely held in substrate holder 102.

When the loading operation is complete, peripheral lifting plate 33 of substrate pick-up 3 is positioned in the opening between first and second circular portions 111 and 112. Plates 31 and 33 of substrate pick-up 3 are slightly below substrate 2. The moving mechanism then withdraws substrate pick-up 3 and positions it at a "standby" position.

The operation to remove substrate 2 from the substrate holder is performed in the reverse sequence to the operation for loading substrate 2. Substrate pick-up 3, which is in the standby position, is moved to a position to lift the substrate. As shown in FIG. 1A, the rod 38 is inserted into the cavity on arm 16.

The moving mechanism then causes substrate pick-up 3 to be lifted. Substrate 2 is supported by central lifting plate 31 and peripheral lifting plate 33 as shown in FIG. 3. The moving mechanism continues to raise substrate pick-up 3 to the raised position. During this operation, rod 38 engages arm 16 pushing it up. Coil spring 17 passes through the dead point, and arm 16 adopts the open state as shown in FIG. 1B. This disengages movable support claw 143 from the top edge of substrate 2. A stopper 18 on base plate 100, prevents arm 16 from moving upward beyond a horizontal position.

After substrate 2 has been positioned in the raised position, the moving mechanism causes substrate pick-up 3 to withdraw, such that substrate 2 is removed from the substrate holder. The moving mechanism then conveys substrate 2 to a desired position.

As shown in FIG. 1, with substrate holder 102 of the present invention, the gap formed around substrate 2 in the vicinity of the three support claws 141, 142 and 143 is narrower than at other positions around the periphery of the substrate. This feature of the present invention is based on the research conducted by the inventors into the affect of the support claws on the plasma and the properties of the processed substrate.

When a relatively wide gap is formed between the outer edge of substrate 2 and base plate 100 (or members fixed to base plate 100) as in the conventional substrate holder shown in FIG. 6, plasma can enter the gap. However, there is substantially less entry of plasma into narrow spaces when the size of those narrow spaces is reduced below a certain limit.

As discussed, in the present invention, the gap between substrate 2 and base plate 100 of substrate holder 102 is made narrower in the vicinity of supporting claws 141, 142 and 143. This is based on the research performed by the inventors. If the gap is made sufficiently narrower in the vicinity of supporting claws 141, 142 and 143, little or no plasma will enter into the gap in these regions. Accordingly, the characteristics of the plasma are not materially changed by the presence of supporting claws 141, 142 and 143, and localized variations in the magnetic characteristics of the processed substrate are significantly reduced.

Figure 4A:
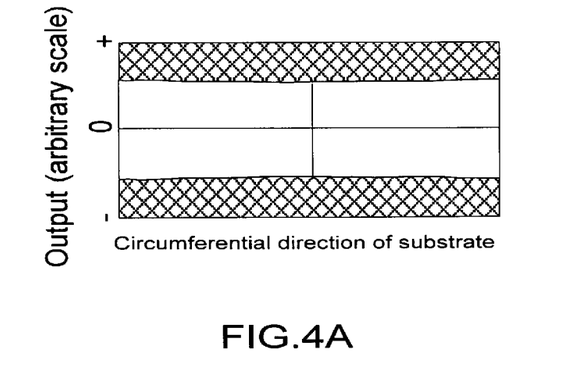
FIG. 4A is a graph showing the magnetic characteristics of a thin film at a position 40 mm from the substrate center formed using the inventive substrate holder.
Figure 4B:
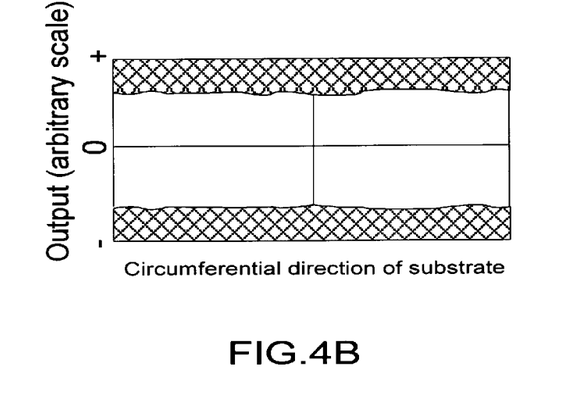
FIG. 4B is a graph showing a reduction of the adverse magnetic characteristics of a thin film at a position 46.5 mm from the substrate center which is achieved by narrowing the gap between the substrate and substrate holder in the region near the supporting claws, in accordance with the inventive substrate holder.

FIG. 4A is a graph showing the magnetic characteristics of a thin film at 40 mm from the substrate center formed using the inventive substrate holder. FIG. 4B is a graph showing a reduction of the adverse magnetic characteristics of a thin film at a position 46.5 mm from the substrate center which is achieved by narrowing the gap between the substrate and substrate holder in the region near the supporting claws, using the inventive substrate holder. Specifically, FIGS. 4A and 4B show the modulation characteristics using the substrate holder of the present invention of a magnetic thin film deposited on a substrate 2 by sputtering.

As FIG. 4B shows, the magnetic thin film using the substrate holder of the present invention exhibits none of the modulation seen in FIG. 9B. This suggests that there was no variation in the plasma characteristics due to the presence of the supporting claws, which affects the modulation characteristics.

Figure 5:
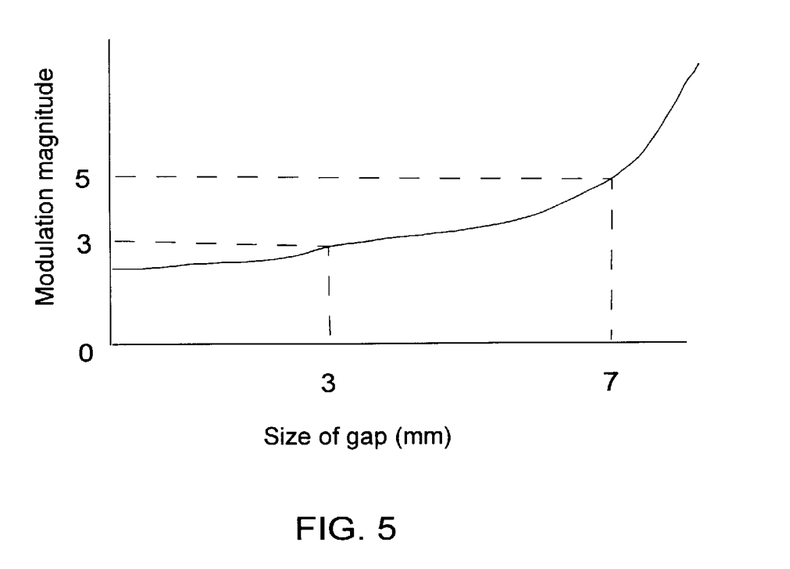
FIG. 5 is a graph showing the relationship between the gap between a substrate and the substrate holder and the magnitude of the resulting adverse magnetic characteristics of a deposited magnetic thin film.

The relationship between the size of the gap between the substrate and substrate holder and the modulation characteristics of a deposited magnetic thin film is described with reference to FIG. 5, which is a graph showing the magnitude of the modulation versus the gap size. As shown in the figure, as the gap between the substrate and substrate holder narrows, the plasma becomes less able to enter the region and the modulation decreases. The size of gap for which the entry of plasma is substantially eliminated is dependent on the plasma conditions. The factor having the largest influence on the plasma entry into the gap is believed to be the plasma pressure. FIG. 5 shows the results obtained when argon gas plasma is formed at a pressure of 5 mTorr (milli-torr), while varying the gap in the spaces around supporting claws 141, 142 and 143. In FIG. 5, the magnitude of the modulation is expressed as a height relative to the height of the peaks shown in FIG. 9B, that is $[(a/b)*100(\%)]$.

As FIG. 5 shows, with a pressure of 5 mTorr the modulation is kept within 3% of the value of the peak shown in FIG. 9B, up to a gap size of approximately 3 mm. A 3% variation is acceptable. When the gap becomes larger than 7 mm, the amount of modulation exceeds 5%, and practical difficulties arise.

According to the inventors' studies, a gap of up to 3 mm causes virtually no modulation problems at the plasma pressures typically used in common semiconductor processing. Even with a gap of up to 7 mm, the amount of modulation is unlikely to cause practical difficulties under most pressures used for the processing of substrates. Accordingly, although a gap size of 3 mm is most preferable, a gap of no more than 7 mm is suitable for most practical purposes.

In the substrate holder of the present invention, arm 16 opens and closes in conjunction with the up and down movement of substrate pick-up 3. Although this configuration has the added advantage of reducing the time needed to load and unload substrate 2, the present invention is not limited to this form. Arm 16 can be provided with its own opening/closing mechanism separate from that of substrate pick-up 3. For example, such an opening/closing mechanism might be associated with a pin that enters the cavity on the right side of opening/closing arm 16 and a mechanism that moves this pin horizontally and vertically.

The inventive substrate holder can be used as part of a thin film deposition device of the type shown in FIG. 8, and can also be used in other processing devices, such as etching devices and surface treatment devices.

Furthermore, although substrate 2 was described as being circular, a rectangular substrate 2 such as a liquid crystal substrate may also be used in connection with the inventive substrate holder.

With the present invention as described herein, since the gap formed around the substrate is made narrower in the vicinity of the supporting claws, the presence of the supporting claws does not affect the substrate processing characteristics. This means that processing can be performed with uniform quality across the surfaces of the substrate, including at outer periphery positions in the circumferential direction near the support claws.

The inventive substrate holder disclosed herein facilitates substrate processing with uniform quality without localized variations in the process characteristics caused by the presence of the supporting claws which are found when using prior art substrate holders. The inventive holder includes a plurality of supporting claws attached to the edge of an opening provided in a base plate, at least one of which is a movable supporting claw that is capable of engaging the edge of the substrate. When a substrate is loaded in the holder, the space around the substrate is substantially filled by the base plate or members attached to the base plate. In the vicinity of each of the support claws, the gap formed around substrate may be narrower than at other positions, and typically does not exceed 7 mm.

The substrate is processed by forming a plasma in the space surrounding the substrate. Since the gap is narrow close to the support claws, the plasma is substantially prevented from entering and there are no (or only substantially insignificant) localized variations in the characteristics of the process and hence the deposited films.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

What is claimed is:

1. A substrate holder to support a substrate in a vertical position, comprising:
   a base plate having a base plate opening into which the substrate may be placed;
   a plurality of supporting claws attached to the base plate so as to come into contact with an outer edge of the substrate and support the substrate in a vertical position when the substrate is placed in the base plate opening, wherein at least one of the plurality of supporting claws is a movable supporting claw that can be brought into contact with and separated from the outer edge of the substrate, and
   wherein the base plate and base plate opening are such that when a substrate has been placed into the base plate opening, a gap between the substrate and the base plate is narrower adjacent to the supporting claws in the circumferential direction than at other positions in the circumferential direction.

2. The substrate holder of claim 1, wherein the gap between the substrate and the base plate or a member attached to the base plate is 7 mm or less adjacent to the supporting claws in the circumferential direction.

3. The substrate holder of claim 1, wherein the movable supporting claw is attached to an opening/closing arm hinged to the base plate, the opening/closing arm extending along part of the outer edge of the substrate and maintaining an equidistance from it.

4. The substrate holder of claim 3, wherein the distance between the opening/closing arm and the outer edge of the substrate is 7 mm or less.

5. The substrate holder of claim 1, wherein the gap between the substrate and the base plate or a member attached to the base plate is 3 mm or less adjacent to the supporting claws in the circumferential direction.

6. A substrate holder, comprising:
   a base plate having a base plate opening into which a substrate may be placed, the base plate including at least one passage formed therein radial to the base plate opening; and
   a plurality of supporting claws attached to the base plate, at least one of the supporting claws being disposed at least partially within the at least one passage to come into contact with an outer edge of the substrate and support the substrate in a vertical position when the substrate is placed in the base plate opening, at least one of the plurality of supporting claws being a movable supporting claw that can be brought into contact with and separated from the outer edge of the substrate;
   wherein the base plate and base plate opening are such that when a substrate has been placed into the base plate opening, a gap between the substrate and the base plate is more narrow at positions adjacent to the supporting claws in the circumferential direction than at other positions in the circumferential direction.

7. The substrate holder of claim 6, wherein the gap between the substrate and the base plate or a member attached to the base plate is no greater than about 7 mm at positions adjacent to the supporting claws in the circumferential direction.

8. The substrate holder of claim 6, wherein the movable supporting claw is attached to an arm hinged to the base plate, the arm extending along part of the outer edge of the substrate and maintaining a substantially equidistant length from the outer edge of the substrate.

9. The substrate holder of claim 8, wherein the distance between the arm and the outer edge of the substrate is no greater than about 7 mm.

10. The substrate holder of claim 6, wherein the gap between the substrate and the base plate or a member attached to the base plate is no greater than about 3 mm at positions adjacent to the supporting claws in the circumferential direction.

* * * * *

UNITED STATES PATENT AND TRADEMARK OFFICE
CERTIFICATE OF CORRECTION

PATENT NO. : 5,976,255
DATED : November 2, 1999
INVENTOR(S) : Takaki, et al

It is certified that error appears in the above-indentified patent and that said Letters Patent is hereby corrected as shown below:

| | |
|---|---|
| Column 1, line 41-42: | Delete "supporting" and insert therefor --support--. |
| Column 1, line 47: | Before "movable" insert --the--. |
| Column 1, line 48: | Before "claw" insert --support--. |
| Column 1, line 52: | Before "claw" insert --support--. |
| Column 2, line 3: | Before "claw" insert --movable support--. |
| Column 2, line 4: | Before "claw" insert -- movable support--. |
| Column 2, line 40: | Before "support" insert --fixed--. |
| Column 3, line 8: | Before "sources" insert --sputtering--. |
| Column 3, line 37: | After "using" insert -- the--. |
| Column 4, line 32: | Before "claws", delete "supporting" and insert therefor --support--. |
| Column 6, line 33: | Delete "Claw" and insert therefor --Support claw--. |
| Column 11, line 30: | Delete "supporting" and insert therefor --support--. |
| Column 11, line 34: | Delete "supporting" and insert therefor -- support--. |
| Column 11, line 35: | Delete "supporting" and insert therefor --support--. |

UNITED STATES PATENT AND TRADEMARK OFFICE
CERTIFICATE OF CORRECTION

PATENT NO. : 5,976,255
DATED : November 2, 1999
INVENTOR(S) : Takaki, et al

It is certified that error appears in the above-indentified patent and that said Letters Patent is hereby corrected as shown below:

| | |
|---|---|
| Column 11, line 41: | Delete "supporting" and insert therefor --support--. |
| Column 11, line 47: | Delete "supporting" and insert therefor --support--. |
| Column 11, line 49: | Delete "supporting" and insert therefor --support--. |
| Column 12, line 10: | Delete "supporting" and insert therefor --support--. |
| Column 12, line 17: | Delete "supporting" and insert therefor --support--. |
| Column 12, line 22: | Delete "supporting" and insert therefor --support--. |
| Column 12, line 23: | Delete "supporting" and insert therefor --support--. |
| Column 12, line 28: | Delete "supporting" and insert therefor --support--. |
| Column 12, line 34: | Delete "supporting" and insert therefor --support--. |
| Column 12, line 37: | Delete "supporting" and insert therefor --support--. |
| Column 12, line 47: | Delete "supporting" and insert therefor --support--. |

Signed and Sealed this

Third Day of April, 2001

*Attest:*

NICHOLAS P. GODICI

*Attesting Officer*     *Acting Director of the United States Patent and Trademark Office*